United States Patent
Arnold et al.

(10) Patent No.: US 6,636,063 B2
(45) Date of Patent: Oct. 21, 2003

(54) PROBE CARD WITH CONTACT APPARATUS AND METHOD OF MANUFACTURE

(75) Inventors: Richard W. Arnold, McKinney, TX (US); James Forster, Barrington, RI (US); Reynaldo M. Rincon, Richardson, TX (US); Lester Wilson, Sherman, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/968,963

(22) Filed: Oct. 2, 2001

(65) Prior Publication Data

US 2003/0062915 A1 Apr. 3, 2003

(51) Int. Cl.⁷ ............................................... G01R 31/02
(52) U.S. Cl. ..................................... 324/762; 324/158.1
(58) Field of Search .............................. 324/754, 762, 324/158.1, 758, 765, 761; 439/482, 66, 67; 29/571, 574, 852, 885, 25.01, 846; 438/14, 15; 205/78

(56) References Cited

U.S. PATENT DOCUMENTS

| | | | | |
|---|---|---|---|---|
| 3,891,924 A | * | 6/1975 | Ardezzone et al. | ......... 324/762 |
| 4,973,903 A | * | 11/1990 | Schemmel | ................... 324/754 |
| 5,521,518 A | * | 5/1996 | Higgins | ...................... 324/754 |
| 6,037,785 A | * | 3/2000 | Higgins | ...................... 324/754 |
| 6,426,638 B1 | * | 7/2002 | Di Stefano | ................. 324/754 |

* cited by examiner

*Primary Examiner*—Kamand Cuneo
*Assistant Examiner*—Jimmy Nguyen
(74) *Attorney, Agent, or Firm*—Wade James Brady, III; Frederick J. Telecky, Jr.

(57) ABSTRACT

A probe card having reliable "micro probe" contacts which include a base and an angled probe tip fabricated as a single unit from a thin sheet of a conductive metal having high tensile and yield strength, and coated with a noble metal. The micro probes are secured into precisely dimensioned, and positioned locations on the card, and are electrically connected to traces on the card. Design of the micro probes includes not only the base and probe tip, but also locking features, a stand-off to prevent over compression, and a necked down stem feature for release from the support strap used in transporting and plating during the manufacturing processes.

22 Claims, 3 Drawing Sheets

PROBE CARD WITH CONTACT APPARATUS AND METHOD OF MANUFACTURE

FIELD OF THE INVENTION

This invention relates to testing of integrated circuits, and more particularly to a method for fabricating a probe card apparatus for the testing of integrated circuits.

DESCRIPTION OF PRIOR ART

Integrated circuits (ICs) are formed as multiple, identical, discrete chips on a semiconductor crystal wafer. In wafer form, each of the integrated circuit chips is normally tested by a computer operated apparatus to exercise the circuits and verify the electrical functions, using a testing process commonly referred to as multiprobe testing. Individual chips may be tested similarly in a die carrier test device.

Conventional multiprobe testing apparatus includes a plurality of rigid or flexible probes to connect the IC device to a substrate having fan out wiring to the test equipment. The substrate, typically a probe card, includes a plurality of electrical leads terminating in conductive needles, which in turn make electrical contact with input/output contacts of the various circuit elements on the integrated circuit chip being tested.

Chip contacts most often are the pads to be electrically connected to the next level of circuitry, and may be referred to as bond pads. Bond pads most often have an aluminum or copper surface, are rectangular in shape, and are recessed slightly below the surface of the passivation layer. Multiprobe testers and die carriers have a plurality of contact mechanisms attached to a substrate mirroring the chip bond pads, and the contacts are fanned to the perimeter by conductors.

A thin, but tenacious aluminum oxide, as well as other insulating contaminants exist on the surface of aluminum bond pads, requiring that the contaminants be penetrated in order to make good electrical contact for accurately testing the circuits. Similarly, copper is subject to various oxides, some of which are insulating and must be penetrated by the probe in order to be tested accurately.

FIG. 1 illustrates a probe card of known technology wherein a plurality of cantilevered needles 11 are arrayed and attached to conductive traces 12 on an insulating polymeric ring 10. The needles 11 are in contact with bond pads 14 on a wafer 15 which is supported on, and moved by a work station platform 13 of a tester.

The needles 11 or probe elements may be secured to the probe ring 10 by an adhesive, or they may be bonded, as by welding to a blade. Typically an opening is provided in the center of the ring for the needles to extend through, and for aligning the needles to bond pads on the device to be tested. The card is in contact with a probe head which provides electrical connection to the controlling computer, and which mechanically brings the needles into contact with bond pads on the chip.

FIG. 2 illustrates in more detail the shape of a conventional probe needle 21 of known art, typically made of rigid metal, such as tungsten. It can be seen from the shape of the needle, that as the tip is brought into contact with the horizontal surface of the IC 25, and as pressure is applied, the rigid tip will begin to penetrate the softer metal bond pad 24 surface. The work station 23 is then moved horizontally to effectively scrub the relatively soft metallic surface of the bond pads 24, and allow ohmic contact to be made.

The needles must be accurately positioned in order to assure that each one makes electrical contact with a contact location or bond pad on the integrated circuit. With conventional probe card needles, final positioning is accomplished by bending the needles after they are mounted on the probe card, which is laborious, time consuming, and expensive.

As the size of integrated circuit shrinks, it becomes more difficult to establish electrical contact with the chip bond pad metal because pads and the distance between pads has decreased, because needles and connections are too large, and because there is insufficient room to allow a scrubbing motion for the needles to penetrate the oxide. Therefore, testing some chips cannot be achieved with conventional needle contacts. In particular, testing with probe cards having conventional needle probes is nearly impossible for high density bond pads on ICs where the pad pitch is 75 microns or less, and the density of contacts is in the range of 400 or greater per device.

The tight pitch of probe needles, and the angles of their projection necessary for these devices is extremely difficult to manufacture, and in turn ensures a high cost. Further, both delivery and maintenance of such cards adds significantly to testing cycle time.

As a result of these issues, a number of attempts have been made to provide alternate probe card technology. Much of the newer technology centers around photolithographically defined conductor leads on polymeric membranes with plated or spring loaded contact mechanisms. Both die carriers and membrane probe cards usually rely on metallic balls or spheres as the contact mechanism. These approaches must have a means for scraping, and for applying pressure to cause the membrane to make uniform contact across the chip. Particulate matter, such as diamonds or metals have been incorporated in the contact devices in an attempt to break the bond pad surface insulators, but these are difficult to control, are subject to incorporation of contamination between the particles which interfere with contact, and further are expensive. The issue of uniform electrical contact, as well as alignment is further aggravated by thermal expansion of the membrane resulting from a significant amount of heat generated by the chip during the testing procedure.

Thin film conductors have an added risk of increased inductance to the circuit, which is a significant issue for testing high speed devices. On the other hand, high resistivity of some probe needles, conductor traces, and multiple connections between the needles, the conductors on the probe card, and those to the probe head can also lead to inductance values which adversely impact the accuracy of chip testing.

Membrane probe cards have a number of issues, including a high cost to fabricate. However, photolithography, etching, and plating does provide a means for conductor uniformity, and allow much more closely spaced conductors.

Because of the aforementioned issues with prior probe card technologies, and because of the anticipation of even tighter bond pad pitch on future integrated circuits, it would be very advantageous to the industry to have a reliable, low cost probe contact apparatus, having a rapid means of fabrication, modification, or repair, having low inductance, and a very high density of contacts.

SUMMARY OF THE INVENTION

It is an object of the current invention to provide a new and useful probe card and probe interface apparatus for establishing temporary electrical connection with high density integrated circuit chip input/output pads.

It is also an object of the invention to provide a reproducible method for rapidly and economically manufacturing a high density probe apparatus.

It is an object of the invention to provide multiple precisely dimensioned probe contact apparatus.

It is yet another object of the invention to provide a robust probe card contact apparatus which minimizes the amount of maintenance required during and after usage.

It is an object of the invention to provide a probe card contact apparatus which is compatible with existing probe card technology, and tester operation.

Yet another object of the current invention is to provide a reliable, high performance probe card contact apparatus capable of being compressed during contact, and returning to its original shape after contact pressure is removed for many testing cycles.

The objectives of this invention are met by providing a new "micro" probe interface apparatus, hereafter referred to as $\mu$-probe, and electrically and mechanically securing a plurality of $\mu$-probes to precise locations on a substrate or probe card.

The $\mu$-probe of the current invention includes a base and an angled probe tip which has been patterned and etched as a single unit from a thin sheet of conductive metal having high tensile and yield strength, and coated with highly conductive, noble metal. These material properties allow fabrication of very small, highly reliable contact devices capable of repeated use. The base of each $\mu$-probe is inserted into a laser drilled slot in a probe card or other substrate, and is adhered to conductive traces on the substrate by soldering or conductive adhesive. Needle tips of the assembled probe card are brought into contact with a device under test (DUT) using conventional probe testing equipment and technology. When the angled probe tip is brought into contact with chip pads, it is partially compressed in the vertical direction, and as the DUT is moved in the horizontal direction, the pad surface is "scrubbed" to penetrate surface contaminants, and allow electrical contact to be made. When the probe card is raised, the spring-like $\mu$-probe needle returns to its original shape.

Design of the $\mu$-probe includes not only the base and probe tip, but also locking features, a stand-off to prevent over compression, and a necked down stem feature for release from the support strap used in transporting and plating during the manufacturing processes.

High resolution, rapid and low cost patterning of multiple $\mu$-probes is accomplished using photolithographic patterning technology similar to that known from the printed circuit industry. The unprotected metal is etched by batch processing, and the parts are plated with a thin film of a highly conductive, noble metal.

The aforementioned probe interface apparatus, its design and method of manufacture is compatible with tight pitch, and high performance requirements of integrated circuits both in current production and those in plans for the future.

The foregoing and other objectives, features and advantages will become more apparent from the following detailed description of preferred embodiments of the invention which proceeds with reference to the accompanying drawings.

DETAILED DESCRIPTION OF THE INVENTION

Figure 3A:
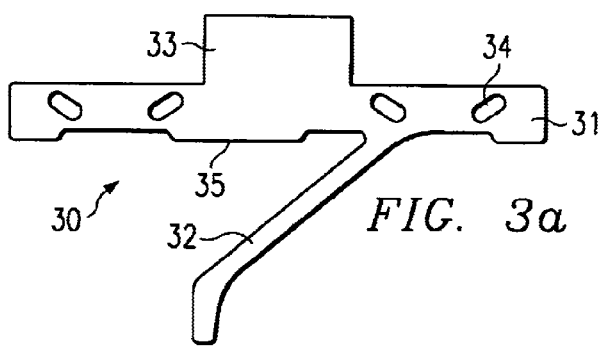
FIG. 3a is a cross sectional view of a preferred embodiment of the $\mu$-probe of the current invention.

A probe interface device and probe card in accordance with the present invention provides a reliable apparatus for testing integrated circuit (IC) chips. FIG. 3a illustrates an embodiment of the micro-probe interface apparatus 30 of the current invention, hereafter referred to as "$\mu$-probe". A preferred embodiment of the $\mu$-probe 30 includes a base unit 31, a needle 32, an insertion neck 33, a series of locks 34, and a standoff 35. The $\mu$-probe is made from a single piece of metal and coated with a thin layer of noble metal.

Figure 4:
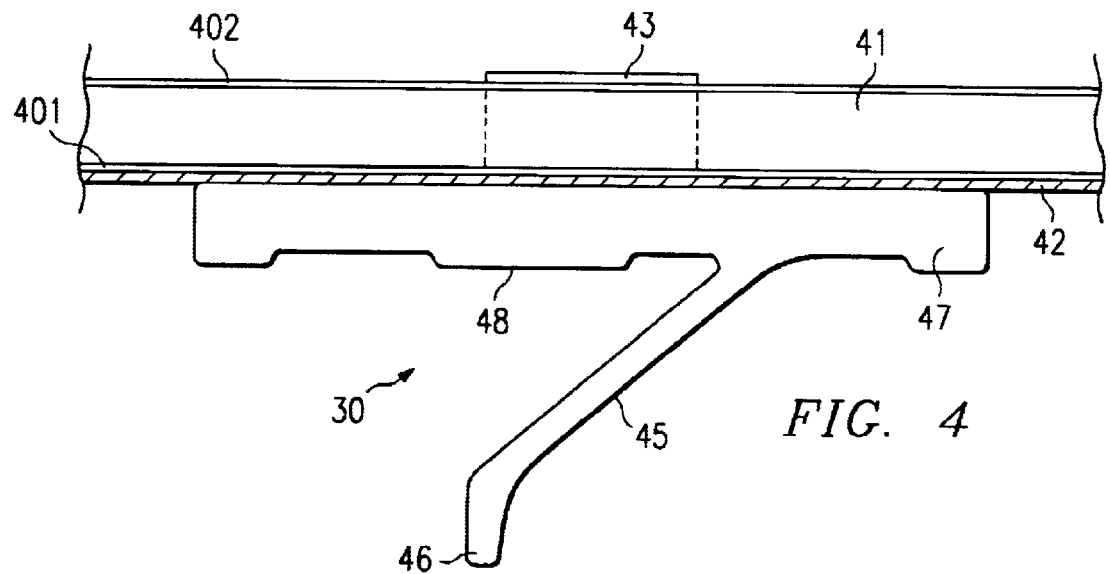
FIG. 4 illustrates a $\mu$-probe inserted in a probe card.

As illustrated in FIG. 4, the $\mu$-probe 30 is inserted into, and electrically connected to a substrate 41 having fan-out conductive traces 42. The substrate 41 is preferably a probe card comprising a somewhat rigid dielectric support medium having one or more layers with conductive traces.

Figure 1:
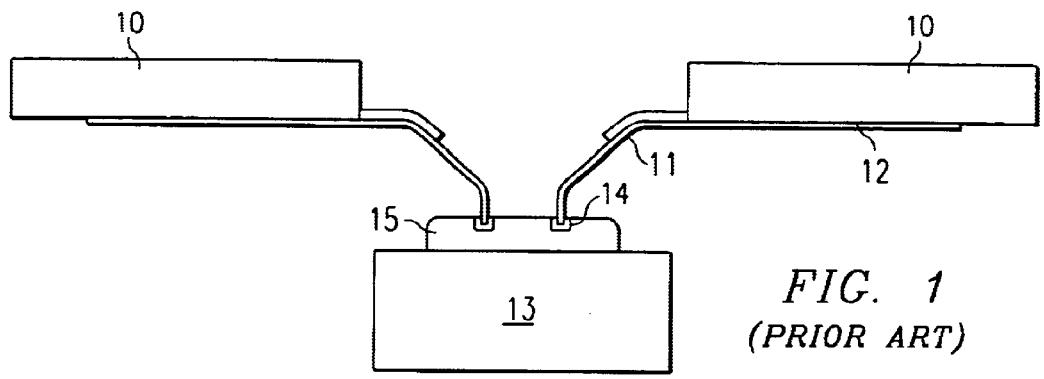
FIG. 1 is a top view of a probe contact apparatus and a conventional probe card. (Prior art)
Figure 2:
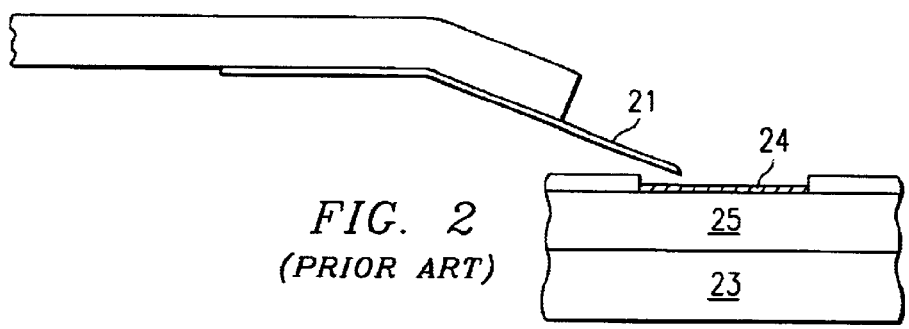
FIG. 2 is a cross section of a cantilevered needle of known technology. (Prior art)

The $\mu$-probe 30 comprises a single unit made from a conductive metal wherein the metal has high yield and tensile strength. The shape of the needle 32 in the preferred embodiment shown in FIG. 3a can be compared with that of a conventional cantilevered probe needle 11 in FIG. 2, and it can be seen that the shape is somewhat similar, albeit much thinner and smaller, and has no joints and/or interfaces on the $\mu$-probe structure, as does the conventional needle probe. In the preferred embodiment, the needle includes two angled portions, the first and longer portion is at an angle in the range of 15 to 45 degrees from the base, and a shorter, more narrow tip approaches a 80 to 100 degree angle. In this embodiment, the short needle tip is about 0.005 to 0.008 inches long and the longer low angle portion is about 0.015 to 0.35 inches long. Overall length of the base is about 0.04 to 0.7 inches by about 0.005 to 0.007 inches high, and the approximately centrally located insertion neck is about 0.010 to 0.02 inches long, and 0.0075 to 0.01 inches high. Dimensions of alternate embodiments will best be determined by substrate design and manufacturing tolerances of the board or substrate.

Figure 3B:
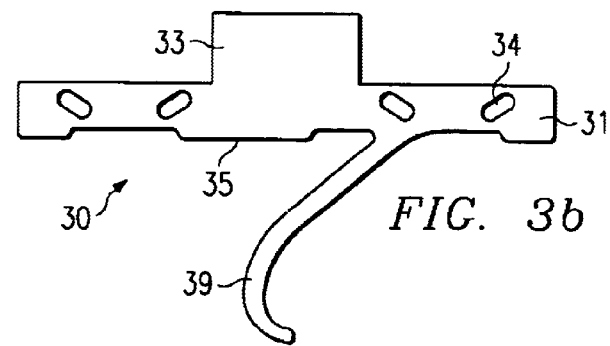
FIG. 3b is a cross section of an alternate embodiment of a $\mu$-probe of the current invention.

Alternate embodiments of the $\mu$-probe modify the shape of the needle 39 to form a more rounded angle, as illustrated in FIG. 3b, or any number of other shapes wherein the needle tip can make contact with the device under test. Dimensions of the needles and tips are varied to meet both mechanical constraints of the device under test, and inductance requirements of the test.

However, the critical prerequisite is that the $\mu$-probe is comprised of a single unit of high strength metal component, having a base, an insertion neck, and a needle.

It is also required that for use in microprobe testing only a small amount of force, in the range of a few grams, can be exerted on the device under test in order to avoid damage to the brittle silicon chip, and to the thin, relatively ductile metal on the bond pads. Further, lateral displacement of a probe under force must be kept to a minimum so as to limit the area of damage to the bond pads, and to avoid damage to surrounding protective dielectric coating on the chip. The μ-probes must survive thousands of touch downs complete with associated abrasion of the bond pad contaminants, therefore, a material, such as BeCu, having both high tensile and yield strength is required because the geometry of the μ-probe is small in comparison to conventional needle probes. Yield strength necessary for the μ-probe material is in the range of 120 to 250 kpsi in order to meet the requirements.

Thickness of the μ-probe is related to the pitch, or distance, between bond pads on the device under test. In one embodiment the μ-probe is about 0.002 inches thick which allows the pitch between probes to be 0.004 inches, or compatible with bond pad designs of 100 microns. In alternate embodiments, the range of thickness may be between 0.0005 and 0.006 inches. The smaller dimensions allowable with the μ-probe technology of this invention will be particularly desirable as the bond pad designs approach 50 microns. Very thin μ-probes which can withstand thousands of contacts are possible because the spring-like material properties, and because multiple interfaces do not exist on the μ-probe.

In FIG. 4, a μ-probe 30 is shown inserted into a precisely dimensioned and positioned slot on a probe card 41 with the μ-probe base 47 resting on the first surface 401 of a probe card, and the insertion neck 43 extending through the card and protruding from the second surface 402 of the card. The probe base 47 is affixed, both electrically and mechanically to traces 42 on the card. Insertion of the neck through the precisely dimensioned aperture in the card provides mechanical stability to the assemblage.

As the tip 46 of μ-probe needle is brought into contact with a device under test, and pressure is applied, the long portion 45 of the needle is forced upward toward the base 47. In the preferred embodiment, a stand-off 48 prevents the needle from excessive flexing beyond the point where the needle is able to spring back.

Figure 5:
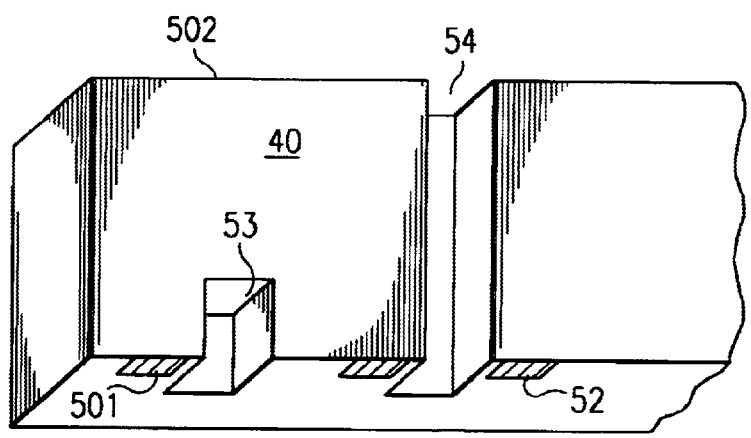
FIG. 5 is a cross sectional view of a probe card having slots for $\mu$-probe insertion.

FIG. 5 illustrates a cross section of a probe card 40 having slots 53 and 54 drilled into and through the card, and having conductive traces 52 arrayed on the first surface 501, which at some location are in close proximity to a slot. The slots 53 and 54 are preferably laser drilled for precision and exact size. Slot 53 is located at a point on the long portion of the opening where the base of the μ-probe is to be subsequently positioned. Slot 54 is shown at the area near the center of the opening, wherein an aperture which extends through the card and exits the second surface 502 as designed for insertion of the probe neck.

The coplanar probe card preferably comprises a composite polymer, having conductive traces of copper having an external coating of solder. Probe card materials, such as ceramics and laminates are alternates. Preferably a probe card of the current invention is compatible with existing technology, and requires modification only for μ-probe insertion and designs. A low expansion probe card material minimizes movement of the μ-probes during testing as a result of chip heating.

Figure 6:
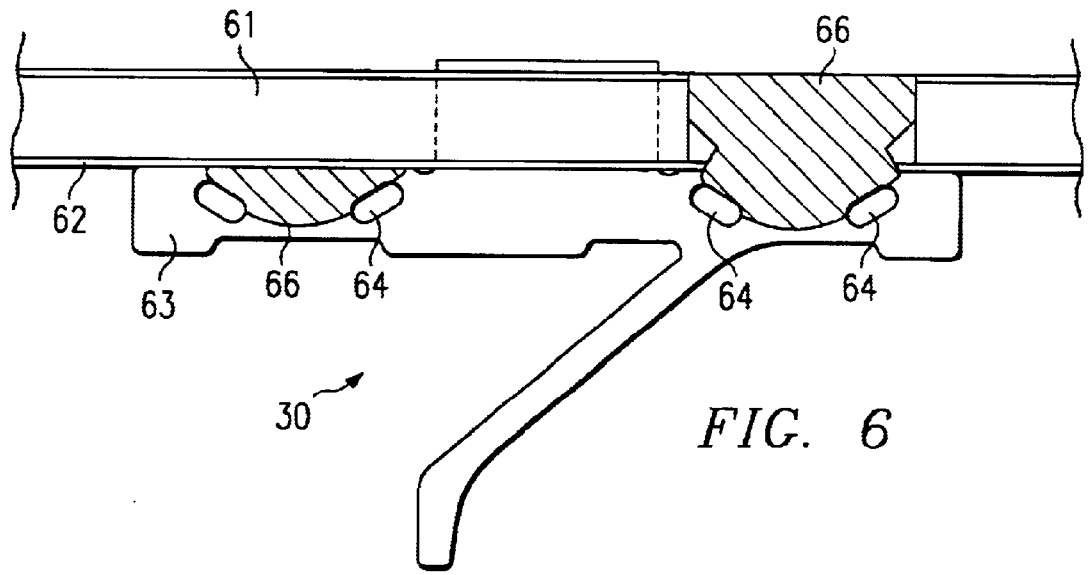
FIG. 6 illustrates a probe card having $\mu$-probes secured electrically and mechanically.

As illustrated in FIG. 6, electrical connection of the μ-probe 30 to conductive trace 62 on the card is made by means of solder 66 or conductive polymer. The somewhat rigid structure of the probe card 61 supports the μ-probe, and solder 66 or a thermosetting polymer holds the probe apparatus securely in place. Holes 64 in the μ-probe base 63 serve as alignment features during insertion, and as an opening for the securing medium, solder 66 or polymer to flow between the faces of the base and to ensure electrical connection to conductive traces 62 on the card, and to provide mechanical support for securing the probe 30 in the card.

Multiple μ-probes fabricated in a manner which ensures that all probes are identical in composition and dimensions, and which are secured to a flat surface of a card require no manual planarization, as do conventional needles. Spring-like quality of the μ-probe material, and single material construction insure that minimum maintenance is required during and after repeated usage.

High performance embodiments of the probe card include customized μ-probe needles wherein the dimensions of one or more μ-probes are designed to provide, or approach a specific impedance level. The fact that the μ-probe comprises a single material having no joints and interfaces supports a low inductance probe needle design. Further optimization of the impedance can be achieved by providing a ground plane on the second surface, or buried level of the probe card.

Key contributors to reproducible μ-probes are material properties, and fabrication techniques. In the preferred embodiment, both are relative non-complex. A conductive metal having high tensile strength, one that is available in sheet stock, one which can be chemically etched, and has been successfully used in spring applications is a beryllium copper (BeCu) alloy. Yield strength of a BeCu material is about 200,000 psi, or well above the level required for a μ-probe. Further, the material is relatively low cost and is highly conductive.

An alternate material, having high yield strength and good relaxation characteristics, both of which are desirable properties for μ-probe fabrication is an eletroformed alloy of nickel/cobalt (Ni—Co), as supplied by NiCoForm. Metrigraphics of 72 Cascade Drive, Rochester, N.Y. 14614. Such materials as the two mentioned, having good stress relaxation characteistics which are desirable for μ-probes which will be used for "burn-in" testing, i.e. testing for extended periods of time at 125–150 deg. C.

The probe contact apparatus of the current invention provides a number of innovative advantages to the semiconductor industry. The method of manufacture lends itself to relatively low cost and rapid cycle time, necessary to respond to the fast paced introduction of chip designs for both new and revised products. The method for manufacture includes the following process steps. Multiple identical μ-probes are fabricated simultaneously from a single sheet of metal, such as BeCu in the range of 0.0005 to 0.006 inches thick. A photoresist is applied to the metal sheet, selected areas are masked, the resist is exposed and developed, and the unprotected metal is removed by chemically etching, leaving multiple probe devices. The fabrication technology is known commercially, and a supplier of such techniques is Precision Arts Co-ordinators of 22 East Almeida Ave., East Providence, R.I. 02914.

Following metal etch, the cleaned parts are plated with a thin layer of Ni, of about 120 to 200 microinches, and a layer of Au in approximate thickness of 50 to 100 microinches. Noble metal probes have been shown to be non-oxidizing contacts which provide good electrical contact with minimal scrubbing of aluminum or copper chip pads, and after thermal exposure from both heat generated during testing and from testing at elevated temperature. See Broz, J. J., et al., "Probe Contact Resistance Variations During Elevated Temperature Test" *Proceedings of IEEE-International Test Conference* 1999, Atlantic City, N.J. pp396–405.

Figure 7:
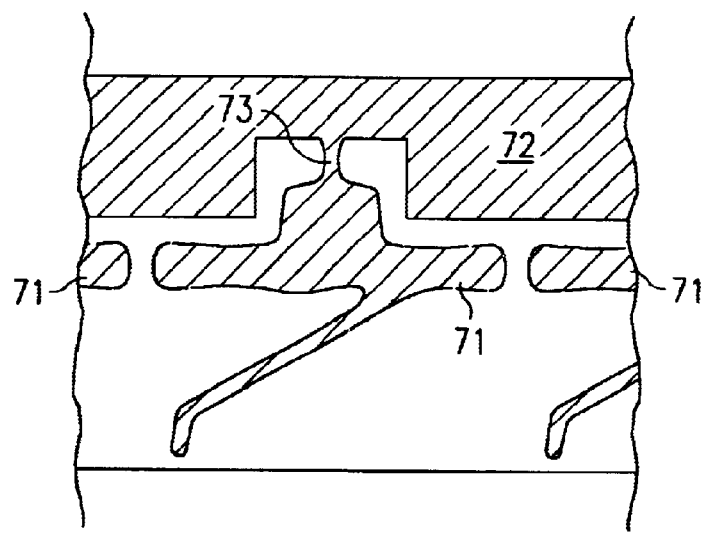
FIG. 7 illustrates an in-process step of multiple $\mu$-probe devices etched from a single sheet of metal.

FIG. 7 illustrates a step in the fabrication of a plurality of μ-probes, wherein the probes 71 remain attached to a supporting structure 72 by a thin stem member 73 through etching and plating. The support structure 72 provides both a connecting medium for transport, and an electrode for plating a thin film of noble metal on the probes. Following plating, individual μ-probes are readily removed from a support strap 72 at the thin portion of the stem 73 which is in about 0.002 to 0.003 inches wide.

After removal of the μ-probes from the support structure, the base with insertion neck is aligned and inserted, preferably by a robot arm into a previously drilled slot in the substrate or probe card. Slots are precisely and accurately drilled by lasers at predetermined locations on the card. The assembled probe card is subsequently connected to a conventional test head, and known test procedures are followed. The probe card of this invention requires no operator retraining, or process changes from those used with existing technology.

The invention has been described with reference to specific embodiments, but it is not intended to limit the scope to a particular form set forth, but on the contrary, it is intended to cover alternatives, modifications, and equivalents as may be included within the spirit of the invention as described by the appended claims.

What is claimed is:

1. A probe card apparatus for contacting and testing integrated circuit chips including:
   a coplanar probe card having first and second major surfaces;
   a plurality of slots of predetermined size and shape arrayed on and into said first surface with a portion of said slots extending to the second surface,
   a plurality of conductive traces on said first surface in close proximity to said slots, and
   a plurality of μ-probes secured into said slots, and connected electrically to said conductive traces, wherein said μ-probes comprise a single high yield strength metal covered by a thin coating of a noble metal, and including a base, a needle, and an insertion neck.

2. An apparatus as in claim 1 wherein the tensile strength of the metal for said μ-probes is in the range of 120 to 250 kpsi.

3. An apparatus as in claim 1 wherein the μ-probe includes a stand-off to prevent excessive deformation of said needles.

4. An apparatus as in claim 1 wherein said μ-probe includes a series of apertures through the base.

5. An apparatus as in claim 1 wherein said μ-probes comprise a BeCu alloy.

6. An apparatus as in claim 1 wherein said μ-probes are in the range of 0.0005 to 0.006 inches thickness.

7. An apparatus as in claim 1 wherein the design dimensions of said needle are predetermined to provide a specific inductance value.

8. An apparatus as in claim 1 wherein said μ-probe comprises a Ni/Co metal alloy.

9. An apparatus as in claim 1 wherein said noble metal coating comprises a thin layer of nickel covered by a layer of gold.

10. An apparatus as in claim 1 wherein said insertion neck of the μ-probe extends through the slot in the card.

11. An apparatus as in claim 1 wherein said μ-probe is secured to said card by solder.

12. An apparatus as in claim 1 wherein said μ-probe is secured to said card by a conductive adhesive.

13. An apparatus as in claim 1 wherein said probe card comprises a composite polymer.

14. An apparatus as in claim 1 wherein said probe card comprises ceramic.

15. An apparatus as in claim 1 wherein said probe card comprises a laminate polymer.

16. An apparatus as in claim 1 wherein said slots in the probe card are precisely dimensioned by laser.

17. An apparatus as in claim 1 wherein said slots include a long section partially extending into the card, and a shorter more centrally located portion through said card.

18. An apparatus as in claim 1 wherein the size of the first portion of the slots in the card are slightly larger than the length and width of the base of said μ-probe, and the size of the second portion is similarly related to the insertion neck size.

19. An apparatus as in claim 1 wherein said needles of the μ-probe include a first and second portion, wherein the first portion is at approximately a 15 to 45 degree angle from the base and the second or tip portion is at approximately a 80 to 100 degree angle.

20. A probe device fashioned from a single section of metal having yield strength in the range of 120 to 250 kpsi covered by a thin coating of a noble metal, and including a base, a needle, and an insertion neck.

21. A device as in claim 20 wherein said probes comprise a BeCu alloy.

22. A device as in claim 20 wherein said probes are in the range of 0.0005 to 0.006 inches thickness.

\* \* \* \* \*